(12) United States Patent
Van Den Heuvel

(10) Patent No.: US 9,608,641 B2
(45) Date of Patent: Mar. 28, 2017

(54) ALL DIGITAL PHASE LOCKED LOOP

(71) Applicant: Stichting IMEC Nederland, Eindhoven (NL)

(72) Inventor: Johan Van Den Heuvel, Geldrop (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 15/211,559

(22) Filed: Jul. 15, 2016

(65) Prior Publication Data

US 2017/0019115 A1    Jan. 19, 2017

(30) Foreign Application Priority Data

Jul. 17, 2015   (EP) .................................... 15177206

(51) Int. Cl.
*H03L 7/06*   (2006.01)
*H03L 7/081*   (2006.01)
(Continued)

(52) U.S. Cl.
CPC ............ *H03L 7/0814* (2013.01); *H03L 7/091* (2013.01); *H03L 7/093* (2013.01); *H03L 2207/50* (2013.01)

(58) Field of Classification Search
CPC ....... H03L 7/0814; H03L 7/091; H03L 7/093; H03L 2207/50
(Continued)

(56) References Cited

U.S. PATENT DOCUMENTS 7,205,924 B2*   4/2007   Vemulapalli .......... G04F 10/005
                                                              341/155
7,940,099 B2*   5/2011   Weltin-Wu ........... H03L 7/0991
                                                              327/150
(Continued)

FOREIGN PATENT DOCUMENTS

EP      2 339 753 A1    6/2011

OTHER PUBLICATIONS

Zhuang et al., "A low-power all-digital PLL architecture based on phase prediction", IEEE Conference on Electronics, Circuits and Systems (ICECS), 2012, 797-800.
(Continued)

*Primary Examiner* — Kenneth B Wells
(74) *Attorney, Agent, or Firm* — McDonnell Boehnen Hulbert & Berghoff LLP

(57) ABSTRACT

An all-digital phase-locked loop (AD-PLL) and related methods and computer readable medium are provided. The AD-PLL comprises a reference phase generator for receiving a digital signal and splitting the digital signal into an integer part and a fractional part, an estimator block for estimating a control signal, and a digital-to-time converter for receiving the estimated control signal and a reference clock signal and for deriving a delayed reference clock signal. The AD-PLL also includes a time-to-digital converter for receiving the delayed reference clock signal and a desired clock signal phase, and for deriving a fractional phase error. The estimator block receives the fractional phase error and determines the estimated control signal by correlating the fractional phase error with the fractional part, yielding a correlated signal, multiplying the correlated signal with its absolute value, and integrating the outcome of the multiplying to obtain the estimated control signal.

20 Claims, 10 Drawing Sheets

(51) Int. Cl.
*H03L 7/093* (2006.01)
*H03L 7/091* (2006.01)

(58) Field of Classification Search
USPC .......................................................... 327/159
See application file for complete search history.

(56) References Cited

U.S. PATENT DOCUMENTS

| | | | | |
|---|---|---|---|---|
| 8,237,511 | B2* | 8/2012 | Kobayashi | H03L 7/085 |
| | | | | 327/150 |
| 8,362,815 | B2* | 1/2013 | Pavlovic | H03L 7/081 |
| | | | | 327/156 |
| 8,497,716 | B2* | 7/2013 | Zhang | H03L 7/1976 |
| | | | | 327/147 |
| 8,593,182 | B2* | 11/2013 | Lin | H03L 7/081 |
| | | | | 327/107 |
| 8,830,001 | B2* | 9/2014 | Zhuang | H03C 5/00 |
| | | | | 331/1 A |
| 2008/0315959 | A1 | 12/2008 | Zhuang et al. | |
| 2010/0283665 | A1 | 11/2010 | Bashir et al. | |
| 2011/0156783 | A1 | 6/2011 | Pavlovic et al. | |
| 2013/0033293 | A1 | 2/2013 | Zhang | |
| 2013/0093469 | A1 | 4/2013 | Lin et al. | |

OTHER PUBLICATIONS

Chillara et al., "An 860µW 2.1-to-2.7GHz All Digital PLL-Based Frequency Modulator with a DTC-Assisted Snapshot TDC for WPAN (Bluetooth Smart and ZigBee) Applications", IEEE Conference on International Solid-State Circuits (ISSCC), 2014, 3 pages.

Zhuang et al., "Gain Estimatiion of a Digital-to-Time Converter for Phase Prediction All Digital PLL", ECCTD, 2013, 4 pages.

\* cited by examiner

ALL DIGITAL PHASE LOCKED LOOP

CROSS-REFERENCE TO RELATED APPLICATIONS

The present application is a non-provisional patent application claiming priority to European Patent Application No. EP 15177206.8, filed Jul. 17, 2015, the contents of which are hereby incorporated by reference.

FIELD OF THE DISCLOSURE

The present disclosure is generally related to the field of all digital loops for use in various types of low power, high performance applications.

BACKGROUND

In recent years one has seen a proliferation of all-digital phase-locked loops (ADPLL) for RF and high-performance frequency synthesis due to their clear benefits in terms of flexibility, reconfigurability, transfer function precision, settling speed, frequency modulation capability and amenability to integration with digital baseband and application processors. All-digital PLLs have been proposed to achieve savings in both the area cost and the power dissipation. Compared to analog PLLs, all-digital PLLs (ADPLLs) may provide certain aspects in nanoscale CMOS as they dramatically reduce the chip area and further also offer benefits of programmability, capability of extensive self-calibrations and easy portability. In this way power-efficient wireless applications can be envisaged. As the ADPLLs are now employed in high-volume consumer applications, there is a continuous push to provide high performance at low cost and low power consumption.

One substantial problem with conventional ADPLLs is due to the fact that the time-to-digital-converter (TDC) of an ADPLL is traditionally power hungry. In the time domain, the time-to-digital converter acts as phase detector to compare the phase leading/lagging of the input reference clock signal and the output high frequency clock signal.

In low power all-digital phased locked loops (AD-PLL) the clock edges of the digitally controlled oscillator (DCO) are retimed via a delay-to-time converter (DTC), such that that power hungry time-to-digital-converter (TDC) can be reduced in size. However, the actual delay of the elements of a DTC is a function of the process power supply voltage and temperature (PVT). These variations are in the order of ±20% of the designed delay. Therefore the delay elements need to be calibrated, as a misaligned DTC causes degradation of the performance and in some cases renders the AD-PLL inoperable. Conventional calibration algorithms require long settling times and do not converge for small fractional settings.

An example of the traditional approach centered around a time-to-digital-converter is found in the paper "A low-power all-digital PLL architecture based on phase prediction" (J.Zhuang et al., IEEE Int'l Conf. on Electronics, Circuits and Systems, pp. 797-800, December 2012). It presents a phase-prediction ADPLL architecture, which exploits an implicit prediction of the next-edge timing relationship between the variable clock (CKV) and reference clock (FREF) based on current state variables to reduce complexity and power consumption. FIG. 1A shows a simplified diagram of this architecture. The reference phase (PHR) generator 10 accumulates the frequency control word (FCW) at each FREF cycle to provide a digital representation of the desired DCO clock (i.e., CKV) phase. The reference phase generator 10 splits the reference phase PHR into an integer (PHR_I) and a fractional (PHR_F) part for a separate detection of the integer phase error (PHE_I) and fractional phase error (PHE_F). The detection of PHE_I, which may be disabled in the phase-locked condition, can be done by computing the difference between PHR_I and DCO variable phase (PHV) that is the output of a counter (for simplicity, not shown in the figure) triggered by CKV edges and sampled at every reference edge. In the fractional phase detection path the reference clock (FREF) is delayed using a digital-to-time converter (DTC) 30. The DTC overall delay is controlled by the output signal of the estimator block 20, i.e. DTC_ctrl, based on the PHR_F and the sign value of the PHE_F. The relation between the intended delay in a fractional PHR_F of the FREF and the actual physical delay set by the DTC is given by the gain K_dtc of the DTC line. This gain K_dtc is estimated in estimator block 20, where also the phase is predicted. In the phase-locked condition, as shown in FIG. 1B, the delayed reference clock FREF_dly is dynamically phase aligned with CKV, thus a narrow-range TDC 40 can be employed to quantize the time difference between FREF_dly and CKV edges to generate the fractional part of the digital phase error, PHE_F. In some examples, techniques described herein may reduce the timing range and thus the complexity of the fractional part of the phase detection. An error in the estimation of K_dtc (which, as already mentioned, provides the link between the intended delay and the actual physically set delay) causes phase errors and can cause the ADPLL to unlock.

A simplified block diagram of the applied gain estimation algorithm is shown in FIG. 2. In the phase prediction block a zero mean fractional part (PHR_F) of the reference phase received at its input is scaled with a factor a and multiplied by the scaled sign of PHE_F to generate the estimation error (see section 210). This error is filtered by an IIR filter 220 and the IIR filter output is multiplied in section 230 by the step size d of the iterative adaptation algorithm. After integration in section 240 a gain estimation K_dtc is obtained. The K_dtc estimation block is triggered by the reference clock running at the reference rate and may be disabled once the K_dtc estimation is done, or kept running in order to track the K_dtc variation due to temperature and voltage changes.

Some conventional techniques making use of the algorithm shown in FIG. 2, however, suffer from long convergence times (200 µs and more). Such a calibration time makes it unsuitable for fast frequency switching in, for example, an architecture as used in a Bluetooth low Energy radio where transmit and receive switching requires the PLL to jump 500 MHz between transmitter and receiver. Moreover, this technique often is very unstable at small fractional settings where it may not converge at all. An illustration of the stability problem at small fractional parts is provided in FIG. 3. As can be seen in the figure, the estimated K_dtc 310 clearly cannot converge to the correct value 320.

Hence, there is a need for an approach wherein this drawback is avoided or overcome.

SUMMARY

One or more embodiments of the present disclosure may provide for an all-digital PLL (AD-PLL) arranged for calibrating a delay line in the AD-PLL in such a way that long settling times are avoided and wherein small fractional ratios between the RF carrier and the reference clock can be dealt with.

In a first aspect, an all-digital Phase-Locked Loop is provided. The AD-PLL comprises a reference phase generator arranged for receiving a digital signal and for splitting the digital signal into an integer part and a fractional part, an estimator block arranged for estimating a control signal, a digital-to-time converter arranged for receiving the estimated control signal and a reference clock signal and arranged for deriving a delayed reference clock signal using the reference clock signal and the estimated control signal, a time-to-digital converter arranged for receiving the delayed reference clock signal and a desired clock signal phase and for deriving a fractional phase error, characterized in that the estimator block is arranged for receiving the fractional phase error and for determining the estimated control signal by correlating the fractional phase error with a version of the fractional part having zero mean, yielding a correlated signal, multiplying the correlated signal with its absolute value, and integrating the outcome of the multiplying to so obtain the estimated control signal.

Some proposed embodiments may allow for avoiding long settling times and for properly dealing with small fractional ratios between the RF carrier and the reference clock. In order to estimate a control signal to steer the calibration of the time-to-digital converter in the AD-PLL, some embodiments may include the use of an algorithm wherein the correlated signal is multiplied with its absolute value in the process of determining the control signal estimation. Doing so may considerably improve the performance.

In some embodiments, the estimator block is further arranged for determining the estimated control signal by performing a truncation on the outcome of the multiplying. In an example embodiment, the all-digital phase-locked loop may comprise scaling means for scaling the estimated control signal before performing the truncation.

In another embodiment, the estimator block is further arranged for performing clamping on the estimated control signal.

In another embodiment, the multiplying is performed with a power of the absolute value instead of the absolute value itself.

In some embodiments the all-digital phase locked loop further comprises a digital loop filter arranged for receiving the fractional phase error and an integer phase error obtained by computing the difference between the integer part and a variable phase signal.

In yet another embodiment the all-digital phase locked loop further comprises a digital clock oscillator connected to the digital loop filter and arranged for outputting the desired clock signal phase.

In another aspect, the present disclosure relates to a method for calibrating a time-to-digital converter in an all-digital Phase-Locked Loop, the all-digital Phase-Locked Loop comprising a reference phase generator to which a digital signal is fed and split into an integer part and a fractional part, an estimator block estimating a control signal, a digital-to-time converter which receives the estimated control signal and a reference clock signal and derives a delayed reference clock signal using the reference clock signal and the estimated control signal, the time-to-digital converter receiving the delayed reference clock signal and a desired clock signal phase and for deriving a fractional phase error, wherein the estimator block receives also the fractional phase error and determines the estimated control signal by correlating the fractional phase error with a version of the fractional part having zero mean, yielding a correlated signal, multiplying the correlated signal with its absolute value, and integrating the outcome of the multiplying to so obtain the estimated control signal.

In a third aspect, a non-transitory, computer-readable medium has stored thereon computer instructions that when executed, cause the performance of a set of acts including receiving a digital signal. The set of acts further includes splitting the received digital signal into an integer part and a fractional part. The set of acts further also includes determining, by an estimator block, an estimated control signal. The set of acts yet further includes receiving, by a digital-to-time converter, the estimated control signal and a reference clock signal. The set of acts still further includes deriving, by the digital-to-time converter, a delayed reference clock signal using the reference clock signal and the estimated control signal. The set of acts also includes receiving, by a time-to-digital converter, the delayed reference clock signal and a desired clock signal phase. The set of acts still further includes deriving, by the time-to-digital converter, a fractional phase error, wherein the estimator block receives the fractional phase error and wherein determining, by the estimator block, the estimated control signal comprises determining a correlated signal by correlating the fractional phase error with a version of the fractional part having zero mean, multiplying the correlated signal with the absolute value of the correlated signal, and integrating the outcome of the multiplication.

For purposes of summarizing some embodiments, certain aspects have been described herein. Of course, it is to be understood that not necessarily all such aspects may be achieved in accordance with any particular embodiment. Thus, for example, those skilled in the art will recognize that the present disclosure may be embodied or carried out in a manner that achieves or optimizes one aspect or group of aspects as taught herein without necessarily achieving other aspects as may be disclosed herein.

The above and other aspects of the present disclosure will be apparent from and elucidated with reference to the embodiment(s) described herein.

BRIEF DESCRIPTION OF THE DRAWINGS

The present disclosure will now be described further, by way of example, with reference to the accompanying drawings, wherein like reference numerals refer to like elements in the various figures.

DETAILED DESCRIPTION OF ILLUSTRATIVE EMBODIMENTS

Figure 1A:
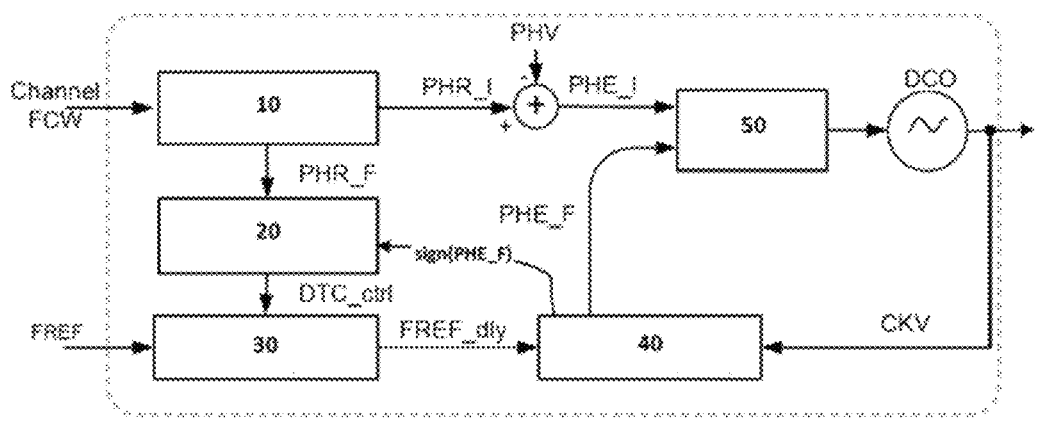
FIG. 1A illustrates a block diagram of a conventional phase-prediction all-digital PLL architecture.

The present disclosure will be described with respect to particular embodiments and with reference to certain drawings but the present disclosure is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the present disclosure described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the present disclosure, various features are sometimes grouped together in a single embodiment, figure, or description thereof for the purpose of streamlining the disclosure and aiding in the understanding of one or more of the various aspects. This method of disclosure, however, is not to be interpreted as reflecting an intention that the present disclosure requires more features than are expressly recited in each claim. Rather, as the following claims reflect, certain aspects lie in less than all features of a single foregoing disclosed embodiment. Thus, the claims following the detailed description are hereby expressly incorporated into this detailed description, with each claim standing on its own as a separate embodiment of the present disclosure.

Furthermore, while some embodiments described herein include some but not other features included in other embodiments, combinations of features of different embodiments are meant to be within the scope of the present disclosure, and form different embodiments, as would be understood by those in the art. For example, in the following claims, any of the claimed embodiments can be used in any combination.

It should be noted that the use of particular terminology when describing certain features or aspects of the present disclosure should not be taken to imply that the terminology is being re-defined herein to be restricted to include any specific characteristics of the features or aspects with which that terminology is associated.

In the description provided herein, numerous specific details are set forth. However, it is understood that embodiments of the present disclosure may be practiced without these specific details. In other instances, well-known methods, structures and techniques have not been shown in detail in order not to obscure an understanding of this description.

As already mentioned, all digital phase locked loops are a low power alternative in modern CMOS technologies. However, due to PVT variations the AD-PLL needs to be calibrated, especially the delay line elements in the feedback path of the AD-PLL. Conventional delay line calibration algorithms fail for small fractional settings in the relation between the RF clock and the reference crystal. Moreover, for conventional settings they require a settling time which is too long for many standards. Some embodiments disclosed herein may present a solution to these issues.

Example embodiments may include the use of more information, such that significant control signals are passed when a phase error measurement is reliable. To improve convergence and stability, the solution space of the calibration loop is preconditioned by applying the second norm. In a fixed point implementation the bit words are rounded such that small disturbances are neglected in the loop, as they have no real control information. More technical details are provided in the rest of this description.

Figure 4A:
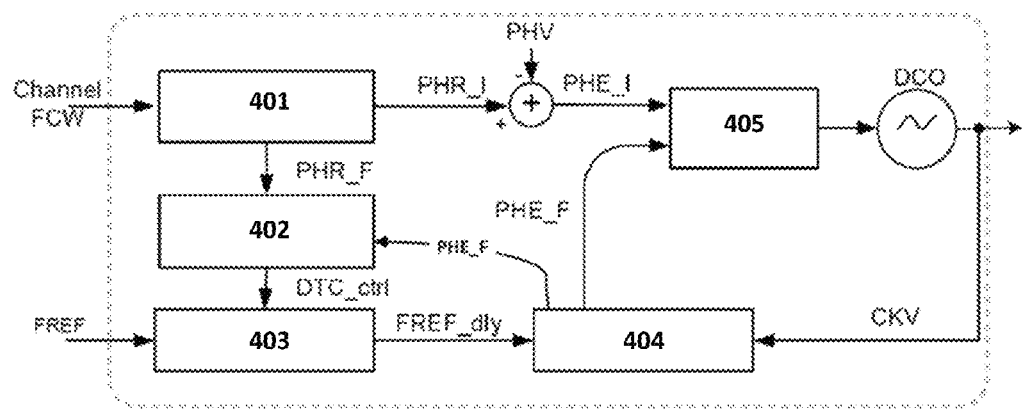
FIG. 4A illustrates an overall block diagram of the all-digital PLL architecture according to an embodiment of the present disclosure.

FIG. 4A represents an embodiment of the proposed AD-PLL architecture. The same control inputs may be used as in the conventional algorithm of FIG. 2. The reference phase (PHR) generator 401 receives a digital signal (being the frequency control word FCW) at its input and accumulates it at each FREF cycle to provide a digital representation of the desired DCO clock (i.e., CKV) phase. The reference phase generator 401 splits the reference phase PHR into an integer (PHR_I) and a fractional (PHR_F) part for a separate detection of the integer phase error (PHE_I) and fractional phase error (PHE_F). The detection of PHE_I, which may be disabled in the phase-locked condition, can be done by computing the difference between PHR_I and DCO variable phase (PHV) that is the output of a counter (for simplicity, not shown in the figure) triggered by CKV edges and sampled at every reference edge. In the fractional phase detection path the reference clock (FREF) is delayed using a digital-to-time converter (DTC) 403. The DTC delay is controlled by the output signal of the estimator block 402, i.e. DTC_ctrl, based on the PHR_F and the PHE_F signal. The relation between the intended delay in a fractional PHR_F of the FREF and the actual physical delay set by the DTC is given by the gain K_dtc of the DTC line. This gain K_dtc is estimated in estimator block 402, where the phase is also predicted. In the phase-locked condition the delayed reference clock FREF_dly is dynamically phase aligned with CKV, thus a narrow-range TDC 404 can be employed to quantize the time difference between FREF_dly and CKV edges to generate the fractional part of the digital phase error, PHE_F. In some embodiments, the AD-PLL further comprises a digital loop filter 405 configured to receive the fractional phase error and an integer phase error obtained by computing the difference between the integer part and a variable phase signal.

Figure 4B:
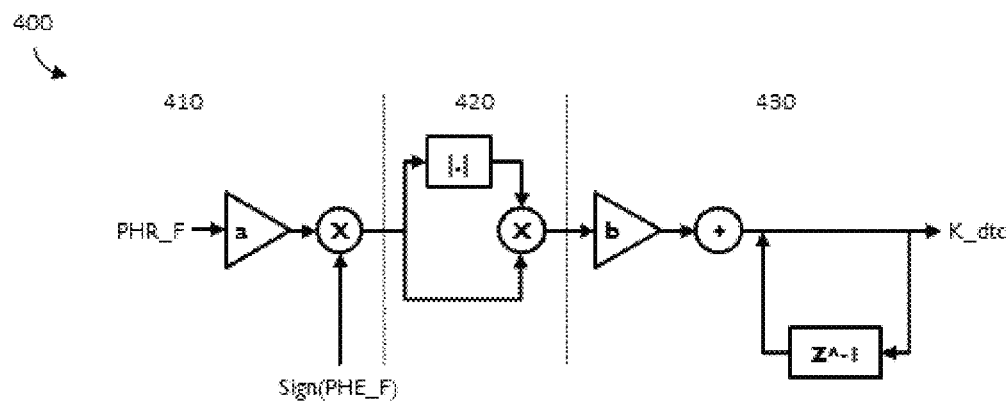
FIGS. 4B-4D show three embodiments of the estimator block.

FIG. 4B shows a first embodiment of the algorithm for the gain estimation of the DTC 403, i.e. K_dtc, applied in the estimator block 402. The distinction with conventional approaches lies in the use of the second norm 420 to condition the solution space. Using this second norm is beneficial because an error involving more phase control gets exponentially more weight than an error involving less phase control. The amount of phase control defines the number of the DTC delay elements involved in its realization. As a net effect this allows for more control when the error measurement is more reliable (since more delay elements are used) and less when the error is less reliable. As illustrated in FIG. 6 this approach (i.e. 2nd norm on and quantization off) has a benefit over that of FIG. 2 in that small fractional values can be used in the system.

Figure 1B:
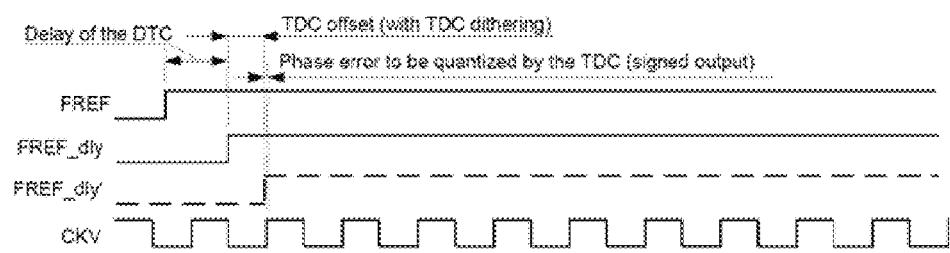
FIG. 1B illustrates the phase-locked condition of the all-digital PLL architecture of FIG. 1A.
Figure 4C:
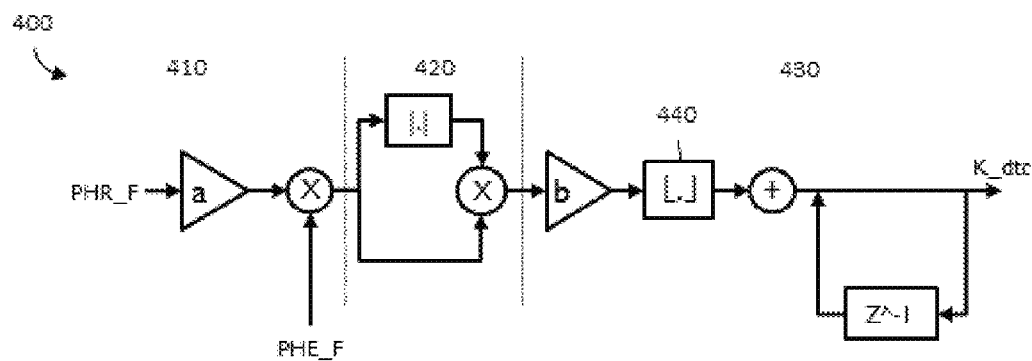

An example embodiment is illustrated in FIG. 4C. More information (i.e. more bits) from fractional phase error signal PHE_F is allowed to enter the control loop. The measured error value is also an indication of the control loop's reliability. If more bit information of PHE_F enters the algorithm and if the error is big, the larger error results in a larger control signal for a similar PHR_F setting compared to single bit operation (i.e. when only the sign information of PHE_F is used as in prior-art solution of FIG. 1).

In an example embodiment, a rounding function is included at the output of the second norm. The rounding function is provided by a truncation block 440 which removes some of the LSB bits of the digital signal at the output of the second norm block 420. For example, the LSBs which are not distinguishable from signals caused by noise can be removed. This rounding thus offers the benefit that small control signals caused by noise or small disturbances are ignored. This means the estimation is more stable when settled. The rounding function of block 440 can be seen as a quantization function.

Figure 4D:
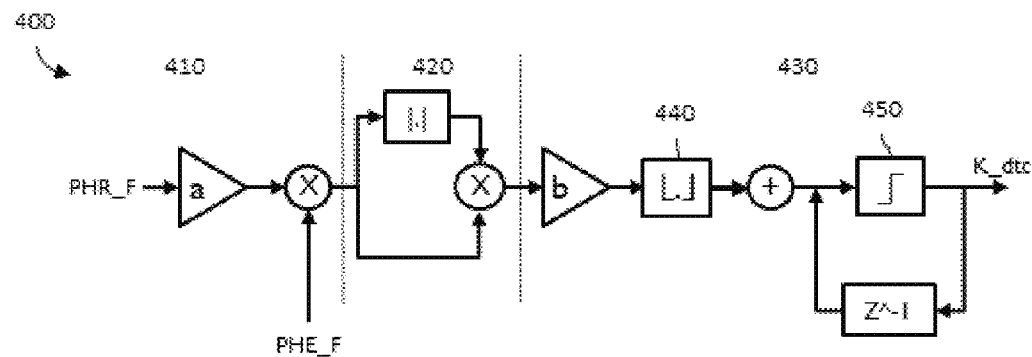

Another embodiment is shown in FIG. 4D. The estimator output is clamped in 450 between 50% and 150% of the nominal value. This allows managing the bit width of the estimated K_dtc signal in a practical implementation. An added benefit is that the control loop cannot converge to a local optimum. Thus, if a disturbance would cause the estimation to drift, the control loop does not lock onto a sub optimum value.

In yet another embodiment it is possible to use higher norms than the second norm.

In another embodiment the rounding at the output of the second norm can also be shifted to the input of the second norm, which allows for less costly implementation of the second norm block.

The PHE_F signal can be sign bit only or may contain all or some of the bits for the embodiments of FIG. 4B-4D.

Figure 2:
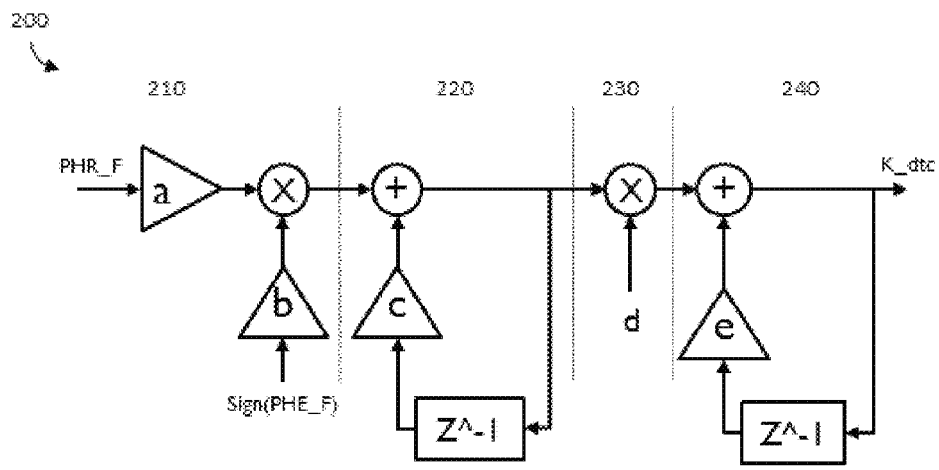
FIG. 2 illustrates a block diagram of the conventional algorithm used to estimate K_dtc.
Figure 3:
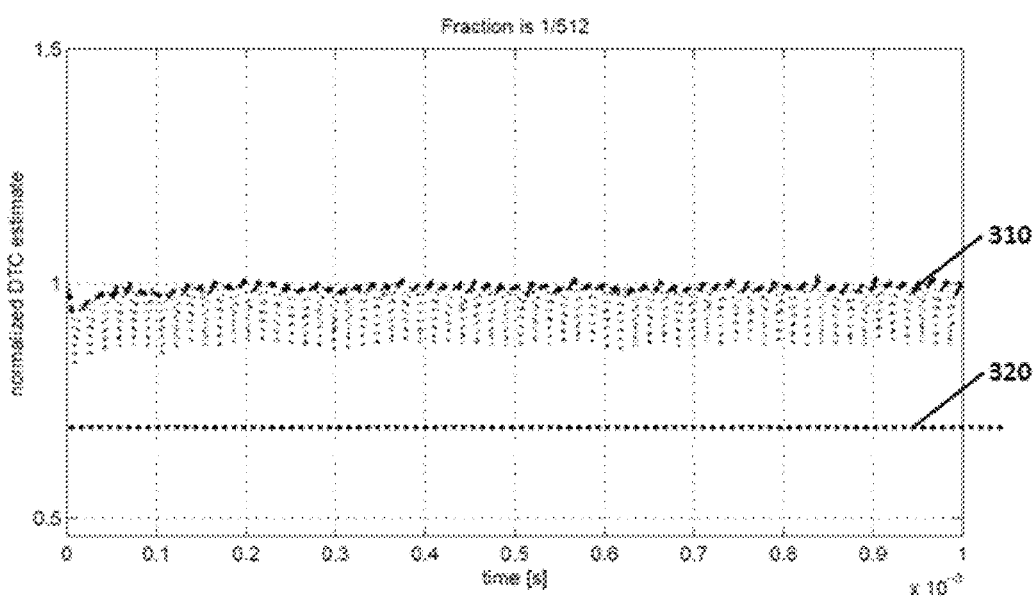
FIG. 3 illustrates a graph showing the stability problem occurring with the algorithm in FIG. 2. The K_dtc is at 70% of the nominal value in this example.
Figure 5A:
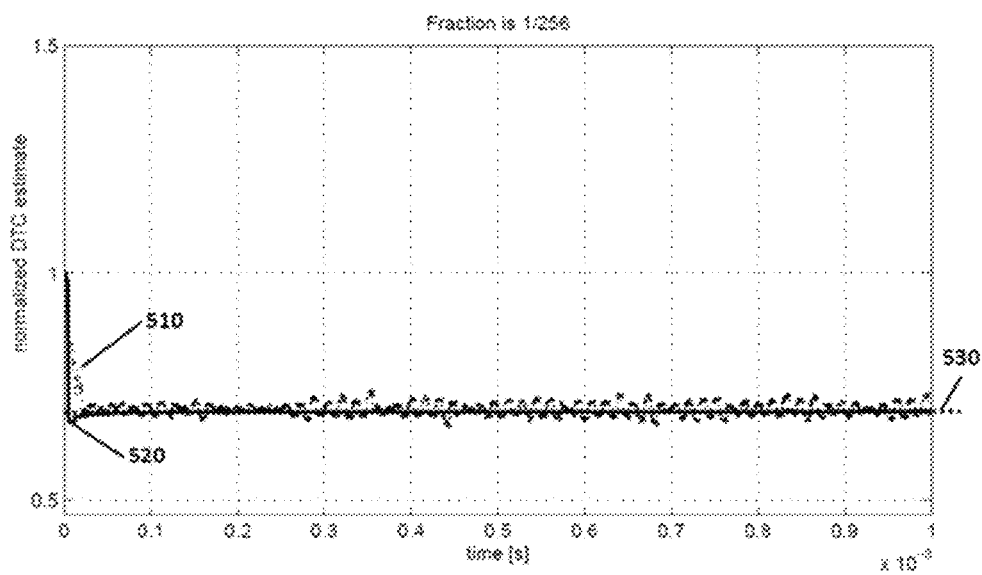
FIGS. 5A-5C illustrate the convergence of the proposed algorithm to the correct value for small fraction values according to one embodiment. The algorithm only controls when the estimates are reliable. The K_dtc is at 70% of the nominal value.
Figure 5B:
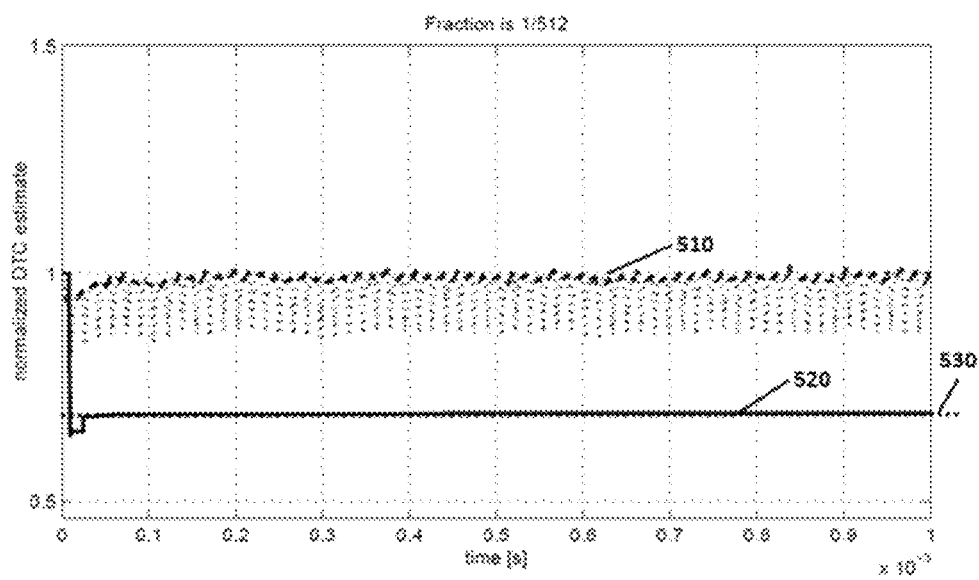
Figure 5C:
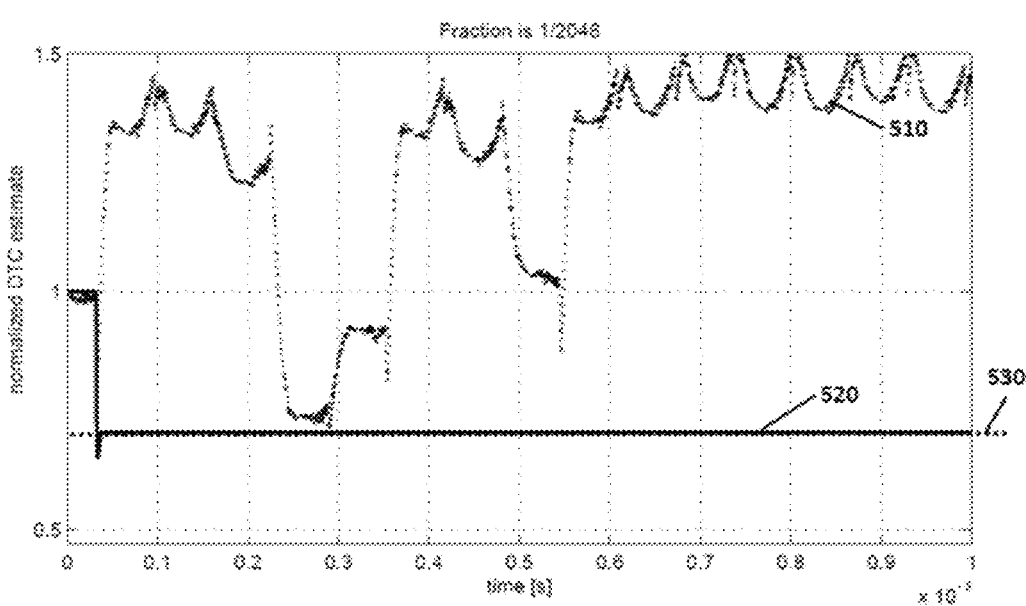
Figure 6A:
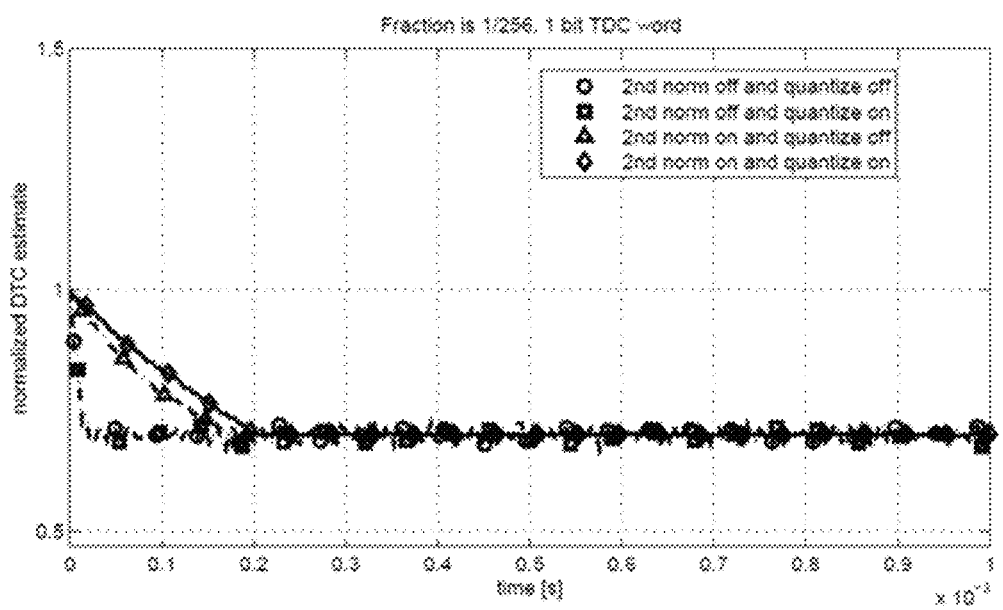
FIGS. 6A-6D illustrate that for small fractional values the proposed algorithm has a larger convergence range than the conventional technique, even if only the sign information of PHE_F is used. It is also shown that proper rounding can increase the stability and convergence speed, as small control steps and disturbances are ignored.
Figure 6B:
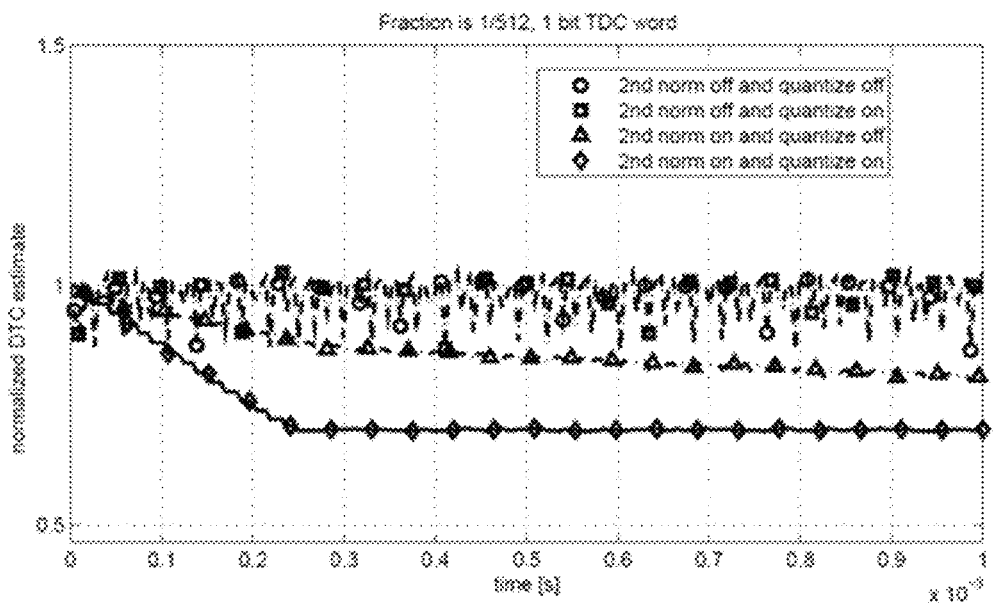
Figure 6C:
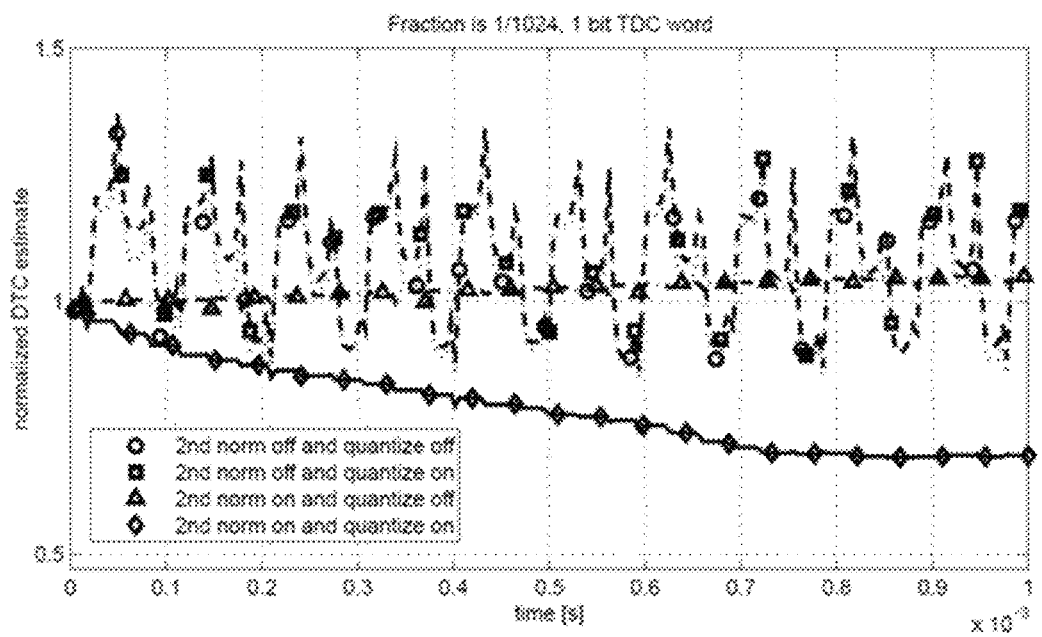
Figure 6D:
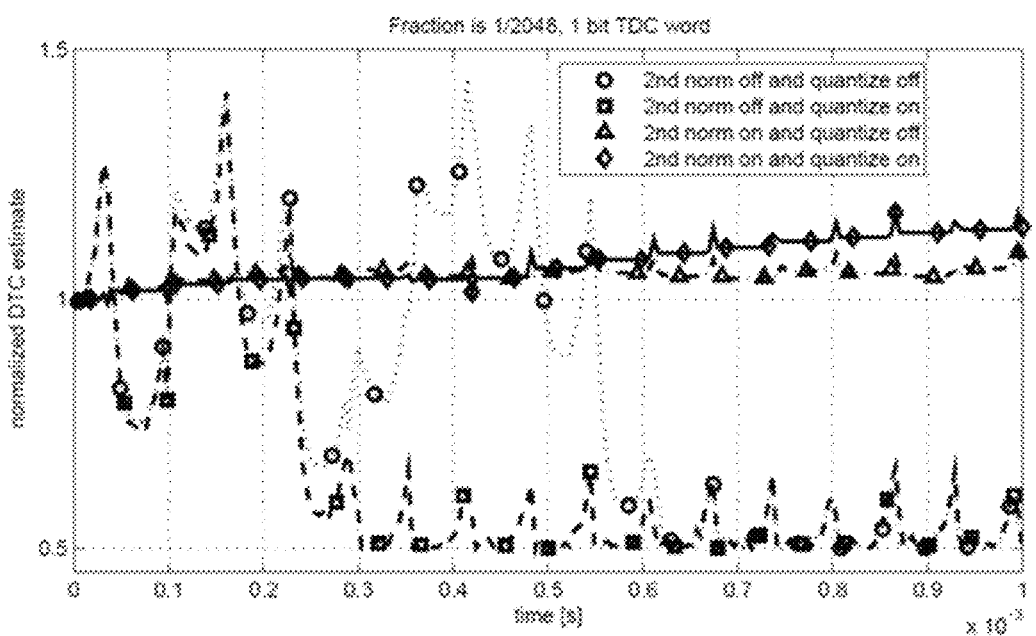

In order to illustrate some example effects of the proposed techniques, some simulation results are now presented. In FIG. 5A to 5C the conventional approach of FIG. 2 is compared to the various embodiments of the proposed technique as shown in FIG. 4D for a PHR_F of $\frac{1}{256}$, $\frac{1}{512}$ and $\frac{1}{2048}$ values, respectively. In the simulation the actual K_dtc to which an algorithm has to converge is set to 70% of the nominal value (i.e. value of 1). It can clearly be seen that the K_dtc value estimated using the conventional algorithm (see line 510) fails to reach the correct value of 0.7 (see line 530) at fractional values smaller than $\frac{1}{512}$, while the algorithm of embodiment of FIG. 4D reaches convergence very fast even for fractional values of $\frac{1}{2048}$. One can also observe that the embodiment of FIG. 4D only performs control when the measured error is reliable and converges fast to the correct value 530. After convergence K_dtc remains stable around the correct value compared to the conventional algorithm.

In FIGS. 6A to 6D the behavior of the algorithm of the different embodiments of FIG. 4B to 4C is compared with similar control input as the conventional algorithm of FIG. 2 (2nd norm off and quantize off) for a range of fractional values, i.e. $\frac{1}{256}$, $\frac{1}{512}$, $\frac{1}{1024}$ and $\frac{1}{2048}$. As one can see in FIG. 6 the algorithm proposed in FIG. 4C (second norm on and quantize on) converges much faster for smaller fractional values with the same 1 bit TDC word as control input, i.e. only using the sign information of the PHE_F. Furthermore, even after convergence, the estimated K_dtc is more stable compared to the conventional solution. The proposed algorithm of FIG. 4B (2nd norm on and quantize off) also converges to the correct value of 0.7 but the time to convergence is longer in comparison to the algorithm of FIG. 4C.

Figure 7A:
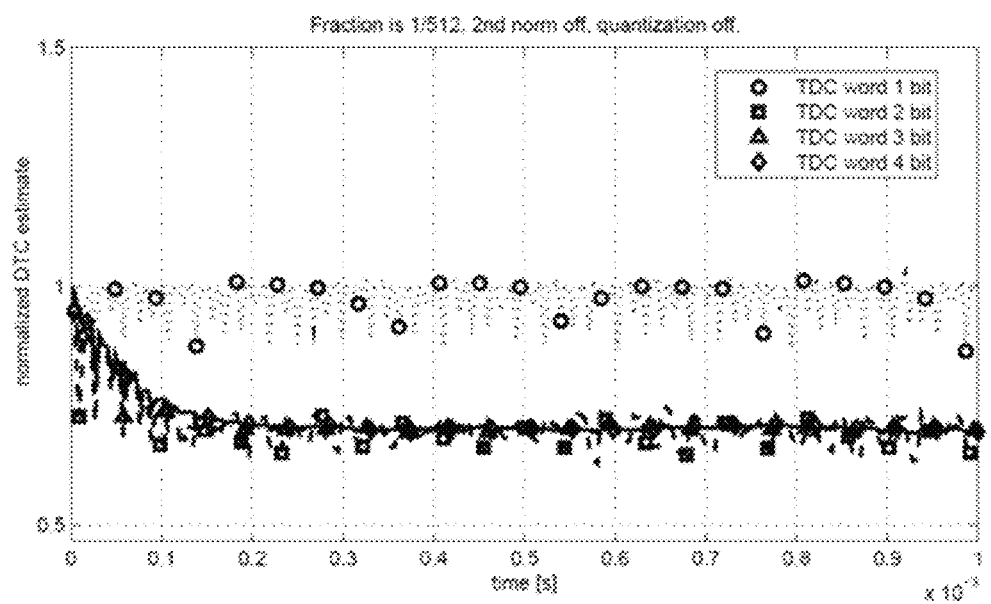
FIGS. 7A-7B illustrate the effect of increasing the resolution of PHE_F in the conventional technique and in an embodiment of the proposed algorithm.
Figure 7B:
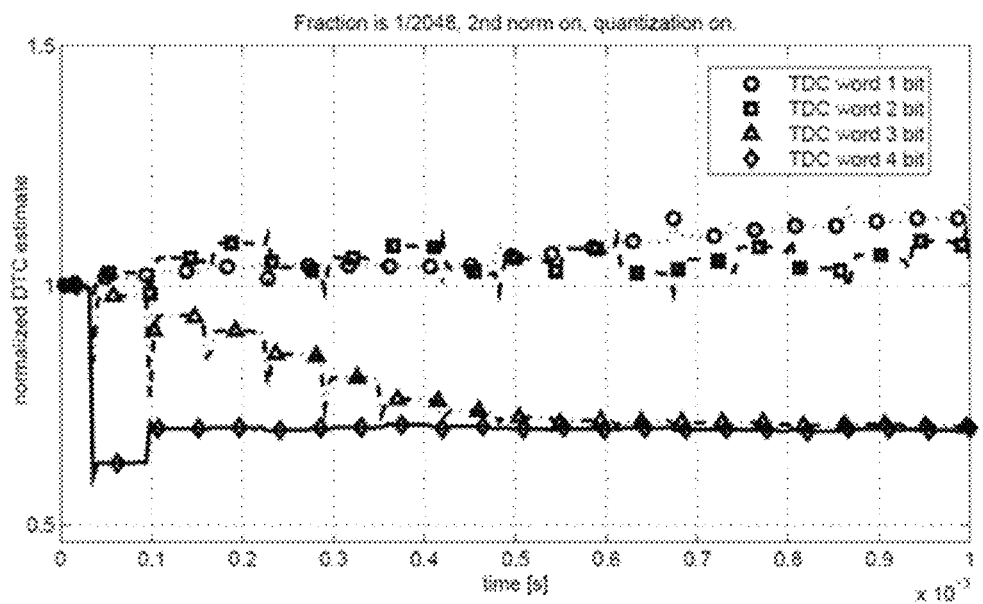

In FIGS. 7A and 7B the effect of using more information from the PHE_F, i.e. using 1 to 4 bits, is shown. As can be seen, the conventional algorithm of FIG. 2 also benefits from using more bit information (see FIG. 7A). This slightly increases the fractional range of the conventional algorithm, however, the prior-art solution is still unstable at small fractional settings (results not shown). In case of the embodiment of FIG. 4D when more TDC information is used, both the convergence speed and the stability after convergence increase (see FIG. 7B).

Figure 8A:
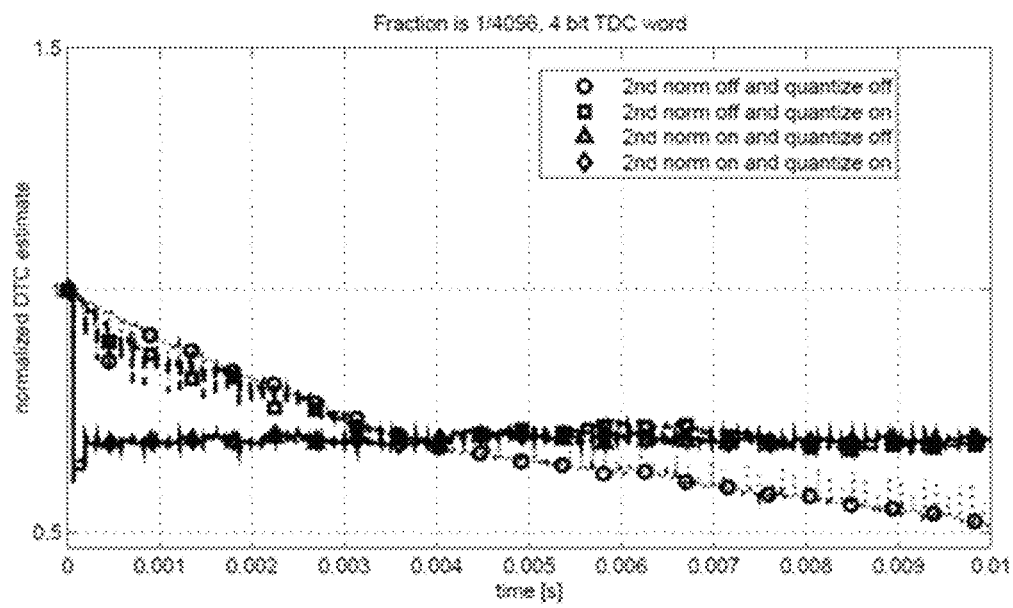
FIGS. 8A-8B show an embodiment in which the proposed algorithm still converges at very small fractional values.
Figure 8B:
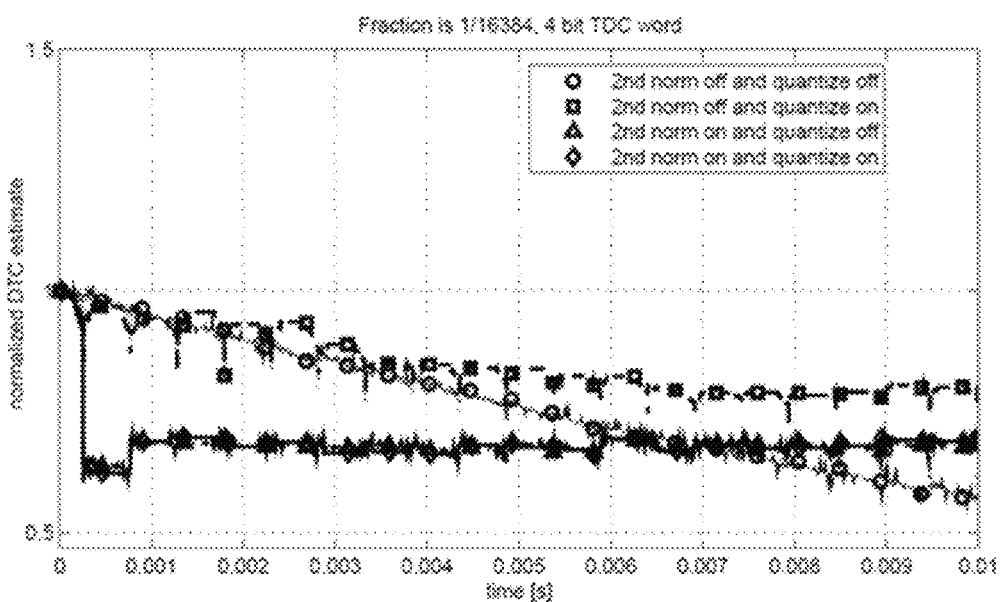

In FIG. 8 the conventional algorithm of FIG. 2 (2nd norm off quantize off) with a 4 bit TDC word is compared to the embodiments of FIGS. 4B (2nd norm on quantize off) and 4C (2nd norm on quantize on). As shown in the figure the proposed algorithm still converges to the correct value of 0.7 even at the extremely small fractional of $\frac{1}{16384}$.

One can observe in FIGS. 5 to 8 that the algorithm converges close to the correct value with the first reliably measured error (i.e. the first correction in the normalized DTC estimate) when a 4 bit TDC word is used. This first reliable measurement corresponds to the moment that the DTC delay line is wrapped around from one end to the other end. In other words, when the accumulated zero mean fractional PHR_F wraps from close to 0.5 to close to −0.5. Around this wrap around moment the largest number of delay elements is used, so the PHR_F is at its largest. When the PHR_F is at its largest, the measured error is also at its largest, because a multiplication of the currently estimated K_dtc with the PHR_F value yields the largest phase error at the moment of wrap around. This means that at the moment of PHR_F wrap around both PHR_F and PHE_F are at their largest and therefore induce the most control information in the loop.

In the TDC design the presence of a zero fractional phase error has been omitted. Therefore the TDC output is always early or late, even when K_dtc is estimated perfectly. Since there always is early late toggling, this introduces continuous control to the K_dtc estimation algorithm. To have better behavior after settling, the rounding is chosen to be such that this early late toggling is mostly ignored.

While example embodiments have been illustrated and described in detail in the drawings and foregoing description, such illustration and description are to be considered illustrative or exemplary and not restrictive. The foregoing description details certain embodiments of the present disclosure. It will be appreciated, however, that no matter how detailed the foregoing appears in text, the present disclosure may be practiced in many ways. The present disclosure is not limited to the disclosed embodiments.

Other variations to the disclosed embodiments can be understood and effected by those skilled in the art in practicing the present disclosure, from a study of the drawings, the disclosure and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be utilized. A computer program may be stored and/or distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. An all-digital phase-locked loop comprising:
   a reference phase generator configured to receive a digital signal and split the received digital signal into an integer part and a fractional part;
   an estimator block configured to determine an estimated control signal;
   a digital-to-time converter configured to (i) receive the estimated control signal, (ii) receive a reference clock signal, and (iii) derive a delayed reference clock signal based on the reference clock signal and the estimated control signal; and
   a time-to-digital converter configured to (i) receive the delayed reference clock signal, (ii) receive a desired clock signal phase, and (iii) derive a fractional phase error based on the delayed reference clock signal and the desired clock signal phase,
   wherein the estimator block is further configured to receive the fractional phase error, and wherein determining the estimated control signal comprises:
   determining a correlated signal by correlating the fractional phase error with a version of the fractional part having zero mean;
   multiplying the correlated signal with an absolute value of the correlated signal; and
   integrating the outcome of the multiplication.

2. The all-digital phase-locked loop of claim 1, wherein the estimator block is further configured to determine the estimated control signal by performing a truncation on the outcome of the multiplication.

3. The all-digital phase-locked loop of claim 2, wherein the estimator block is further configured to scale the estimated control signal before performing the truncation.

4. The all-digital phase-locked loop of claim 1, wherein the estimator block is further configured to perform clamping on the estimated control signal.

5. The all-digital phase-locked loop of claim 1, wherein the multiplication is performed with a power of the absolute value.

6. The all-digital phase-locked loop of claim 1, further comprising a digital loop filter configured to receive the fractional phase error and an integer phase error, wherein the integer phase error is obtained by computing a difference between the integer part and a variable phase signal.

7. The all-digital phase-locked loop of claim 6, further comprising a digital clock oscillator coupled to the digital loop filter and configured to output the desired clock signal phase.

8. A method comprising:
   receiving, by a reference phase generator, a digital signal;
   splitting the received digital signal into an integer part and a fractional part;
   determining, by an estimator block, an estimated control signal;
   receiving, by a digital-to-time converter, the estimated control signal and a reference clock signal;
   deriving, by the digital-to-time converter, a delayed reference clock signal using the reference clock signal and the estimated control signal;
   receiving, by a time-to-digital converter, the delayed reference clock signal and a desired clock signal phase;
   deriving, by the time-to-digital converter, a fractional phase error;
   wherein the estimator block receives the fractional phase error and wherein determining, by the estimator block, the estimated control signal comprises:
   determining a correlated signal by correlating the fractional phase error with a version of the fractional part having zero mean;
   multiplying the correlated signal with an absolute value of the correlated signal; and
   integrating the outcome of the multiplication.

9. The method of claim 8, wherein determining, by the estimator block, the estimated control signal further comprises performing a truncation on the outcome of the multiplication.

10. The method of claim 9, wherein the estimator block is further configured to scale the estimated control signal before performing the truncation.

11. The method of claim 8, wherein determining, by the estimator block, the estimated control signal further comprises performing clamping on the estimated control signal.

12. The method of claim 8, wherein the multiplication is performed with a power of the absolute value.

13. The method of claim 8, further comprising:
   receiving, by a digital loop filter, the fractional phase error and an integer phase error, wherein the integer phase error is obtained by computing a difference between the integer part and a variable phase signal.

14. The method of claim 13, further comprising a digital clock oscillator coupled to the digital loop filter and configured to output the desired clock signal phase.

15. A non-transitory, computer readable memory having stored thereon computer instructions, that when executed by one or more processors cause the performance of a set of acts comprising:
   receiving a digital signal;
   splitting the received digital signal into an integer part and a fractional part;
   determining, by an estimator block, an estimated control signal;
   receiving, by a digital-to-time converter, the estimated control signal and a reference clock signal;
   deriving, by the digital-to-time converter, a delayed reference clock signal using the reference clock signal and the estimated control signal;
   receiving, by a time-to-digital converter, the delayed reference clock signal and a desired clock signal phase;
   deriving, by the time-to-digital converter, a fractional phase error;

wherein the estimator block receives the fractional phase error and wherein determining, by the estimator block, the estimated control signal comprises:
  determining a correlated signal by correlating the fractional phase error with a version of the fractional part having zero mean;
  multiplying the correlated signal with an absolute value of the correlated signal; and
  integrating the outcome of the multiplication.

16. The non-transitory, computer readable memory of claim 15, wherein determining, by the estimator block, the estimated control signal further comprises performing a truncation on the outcome of the multiplication.

17. The non-transitory, computer readable memory of claim 16, wherein the estimator block is further configured to scale the estimated control signal before performing the truncation.

18. The non-transitory, computer readable memory of claim 15, wherein determining, by the estimator block, the estimated control signal further comprises performing clamping on the estimated control signal.

19. The non-transitory, computer readable memory of claim 15, wherein the multiplication is performed with a power of the absolute value.

20. The non-transitory, computer readable memory of claim 15, further comprising:
  receiving, by a digital loop filter, the fractional phase error and an integer phase error, wherein the integer phase error is obtained by computing a difference between the integer part and a variable phase signal; and
  outputting the desired clock signal phase based on the fractional phase error and integer phase error.

* * * * *